(12) United States Patent
Zhai et al.

(10) Patent No.: US 9,657,896 B2
(45) Date of Patent: May 23, 2017

(54) MOUNTING DEVICE

(71) Applicant: ZTE CORPORATION, Shenzhen, Guangdong Province (CN)

(72) Inventors: Shixuan Zhai, Shenzhen (CN); Haiyan Qin, Shenzhen (CN)

(73) Assignee: ZTE CORPORATION, Shenzhen, Guangdong Province (CN)

( * ) Notice: Subject to any disclaimer, the term of this patent is extended or adjusted under 35 U.S.C. 154(b) by 0 days.

(21) Appl. No.: 15/104,955

(22) PCT Filed: Apr. 3, 2014

(86) PCT No.: PCT/CN2014/074763
§ 371 (c)(1),
(2) Date: Jun. 15, 2016

(87) PCT Pub. No.: WO2014/187198
PCT Pub. Date: Nov. 27, 2014

(65) Prior Publication Data
US 2016/0312951 A1    Oct. 27, 2016

(30) Foreign Application Priority Data

Dec. 16, 2013   (CN) ..................... 2013 2 0830579 U

(51) Int. Cl.
*A47B 96/06*   (2006.01)
*F16M 13/02*   (2006.01)
(Continued)

(52) U.S. Cl.
CPC ........... *F16M 13/022* (2013.01); *F16B 2/065* (2013.01); *F16B 2/12* (2013.01); *F16M 11/16* (2013.01); *F16M 13/02* (2013.01); *H05K 7/18* (2013.01)

(58) Field of Classification Search
CPC ...................................................... F16M 13/02
(Continued)

(56) References Cited

U.S. PATENT DOCUMENTS 3,734,438 A * 5/1973 Kautz ...................... H02B 5/02
                                                  211/107
4,860,985 A * 8/1989 Olson ................... F21V 21/116
                                                  248/214

(Continued)

FOREIGN PATENT DOCUMENTS

CN          2433690 Y      6/2001
CN       101534456 A       9/2009
(Continued)

OTHER PUBLICATIONS

International Search Report (Form PCT/ISA/210) for International Application No. PCT/CN2014/074763 mailed Sep. 19, 2014.
(Continued)

*Primary Examiner* — Gwendolyn Baxter
(74) *Attorney, Agent, or Firm* — Koppel, Patrick, Heybl & Philpott

(57) ABSTRACT

A mounting device includes a securing clamp (101), a mounting plate (102), an adapter plate (103) and connectors (104), wherein the securing clamp (101) is provided with at least one mounting hole (1014) at each of two ends of the securing clamp (101) respectively, the connectors (104) mount the securing clamp (101) to a fixed surface through the mounting holes (1014), an equipment mounting surface of the securing clamp (101) is provided with a mounting plate connection device (1011), the mounting plate (102) is connected to the securing clamp (101) through the mounting plate connection device (1011), an equipment connection device (1022) used for securing equipment is provided on the mounting plate (102), the securing clamp (101) is provided with an adapter plate mounting device (1012), used (Continued)

for securing an adapter plate (103), at each of two lateral sides of the securing clamp (101). The mounting device can be expanded to accommodate the mounting of a plurality of devices.

10 Claims, 4 Drawing Sheets

(51) Int. Cl.
*F16B 2/06* (2006.01)
*F16B 2/12* (2006.01)
*H05K 7/18* (2006.01)
*F16M 11/16* (2006.01)

(58) Field of Classification Search
USPC .... 248/310, 346.03, 346.04, 346.05, 346.08, 248/316.4, 316.8, 670; 269/16
See application file for complete search history.

(56) References Cited

U.S. PATENT DOCUMENTS

| | | | |
|---|---|---|---|
| 5,417,395 A * | 5/1995 | Fowler | A61M 5/1413 128/DIG. 26 |
| 6,357,709 B1 * | 3/2002 | Parduhn | F21V 21/116 248/214 |
| 2005/0056744 A1 * | 3/2005 | Ware | F16L 3/137 248/219.4 |
| 2008/0011919 A1 * | 1/2008 | Wen | F16M 11/10 248/219.4 |
| 2009/0188751 A1 * | 7/2009 | Gilliam | A62B 35/0068 182/112 |
| 2010/0108838 A1 * | 5/2010 | DeMartine | F16M 13/022 248/222.14 |
| 2011/0019348 A1 | 1/2011 | Kludt et al. | |
| 2014/0008380 A1 * | 1/2014 | Zou | F16M 13/02 220/752 |

FOREIGN PATENT DOCUMENTS

| | | |
|---|---|---|
| CN | 201836621 U | 5/2011 |
| CN | 102088799 A | 6/2011 |
| CN | 202708522 U | 1/2013 |
| CN | 203375124 U | 1/2014 |
| EP | 2309832 A1 | 4/2011 |
| EP | 2975315 A1 | 1/2016 |

OTHER PUBLICATIONS

Extended European Search Report from corresponding European Patent Appl. No. 14800337.9, dated Dec. 13, 2016.

* cited by examiner

MOUNTING DEVICE

TECHNICAL FIELD

The present disclosure relates to mechanical field, and in particular to a mounting device.

BACKGROUND

At present, outdoor equipment of electronic products is widely used. The outdoor equipment may be mounted on a pole, a wall and so on. Most of the time, an electronic product is fixed on a mounting rod through a mounting device.

Since mounting condition can not be determined generally, there might be a round rod, an angle iron, a steel channel or a wall-hung shelf at the mounting places, and the diameter of the rod, the size of the angle iron and steel channel probably are different, apart from the above, several pieces of equipment may need to be mounted intensively sometimes. Therefore, a higher demand is put forward on the applicability of mounting device and the installability of engineering.

In addition, in the related art, one mounting device can be used for the mounting of one piece of outdoor equipment only. If another piece of outdoor equipment needs to be additionally mounted on the mounting place, a new mounting device is needed, which is very inconvenient.

SUMMARY

The embodiments of the present disclosure provide a mounting device, to solve the problem in the related art that a mounting device cannot be expanded.

An embodiment of the present disclosure provides a mounting device, including: a securing clamp, a mounting plate and connectors, wherein the securing clamp is provided with at least one mounting hole at each of two ends of the securing clamp respectively, the connectors mount the securing clamp to a fixed surface through the mounting holes, an equipment mounting surface of the securing clamp is provided with a mounting plate connection device, the mounting plate is connected to the securing clamp through the mounting plate connection device, an equipment connection device used for securing equipment is provided on the mounting plate, and the securing clamp is provided with an adapter plate mounting device, used for securing an adapter plate, at each of two lateral sides of the securing clamp respectively.

In an exemplary embodiment, a V-shaped groove matched with an arc of a pole is provided in a centre of the fixed mounting surface of the securing clamp contacting the fixed surface.

In an exemplary embodiment, the connectors include arched connectors matched with the pole.

In an exemplary embodiment, the connectors include bolt-nut sets matched with the mounting holes of the securing clamp; the bolt-nut sets fasten two securing clamps on a pole back to back through the mounting holes of the two securing clamps.

In an exemplary embodiment, the mounting plate connection device is at least one mounting groove matched with at least one lug on the mounting plate; the at least one lug on the mounting plate is mounted on the equipment mounting surface of the securing clamp through the at least one mounting groove.

In an exemplary embodiment, the connectors include equipment mounting screws; the equipment connection device on the mounting plate is equipment mounting holes; and the mounting plate is connected with equipment through the equipment mounting holes and the equipment mounting screws.

In an exemplary embodiment, the adapter plate mounting device at each of two laterals of the securing clamp is a mounting structure matched with a mounting groove of the adapter plate.

In an exemplary embodiment, the mounting device further includes: an adapter plate used for securing two securing clamps; wherein each of two surfaces of the adapter plate is provided with a mounting groove matched with the mounting structure at each of two laterals of the securing clamp; two surfaces of the adapter plate are connected with the mounting structures of the two securing clamps through the mounting grooves.

In an exemplary embodiment, the mounting device further includes: a fastener matched with a fastening interface on the adapter plate.

In an exemplary embodiment, each mounting structure of the securing clamp is provided with a fastening groove; a fastening interface matched with the fastening groove is provided on the adapter plate; after the adapter plate is mounted on the securing clamp, the fastener fastens the adapter plate with the securing clamp through the fastening interface and the fastening groove.

The embodiments of the present disclosure have advantages as follows:

With the mounting device provided by the embodiments of the present disclosure, a securing clamp can be connected with another securing clamp through an adapter plate connected on the lateral of the securing clamp, thus the problem in the related art that the mounting device cannot be expanded is solved. The embodiments of the present disclosure can reduce the number of steps and difficulty of high-altitude operations to the greatest extent, shorten the working time of high-altitude operations, and reduce the space occupied by engineering installation, thereby reducing the cost of engineering construction and enhancing security.

The above description is a summary for the scheme of the embodiments of the present disclosure only. To better understand the technical means of the present disclosure, implementation can be made according to the content in the description. In order to make the above and other purposes, features and advantages of the present disclosure clearer, specific embodiments of the present disclosure are provided below.

BRIEF DESCRIPTION OF THE DRAWINGS

Through the detailed description of exemplary embodiments below, various other advantages and benefits become clearer for the ordinary skilled in the art. Accompanying drawings are only to illustrate the purpose of the exemplary embodiments but to limit the present disclosure. In all accompanying drawings, same reference symbols indicate the same parts. In the accompanying drawings.

DETAILED DESCRIPTION OF THE EMBODIMENTS

Exemplary embodiments of the present disclosure are described below in further detail by reference to accompanying drawings. Although accompanying drawings have shown the exemplary embodiments of the present disclosure, however, it should be understood that the present disclosure can be implemented by various ways but limited by the embodiments described below. In stead, these embodiments are provided to help readers thoroughly understand the present disclosure and to completely convey the scope of the present disclosure to those skilled in the art.

In order to solve the problem in related art that a mounting device cannot be expanded, an embodiment of the present disclosure provides a mounting device for a pole, which is easy to operate and has a strong function, so as to improve the efficiency of engineering installation, reduce the space occupied by engineering installation and improve installation reliability, and meanwhile to improve the safety of engineering operation. The present disclosure is described below in further detail in conjunction with accompanying drawings and embodiments. It should be understood that specific embodiments described below are only to illustrate the present disclosure but to limit the present disclosure.

Figure 1:
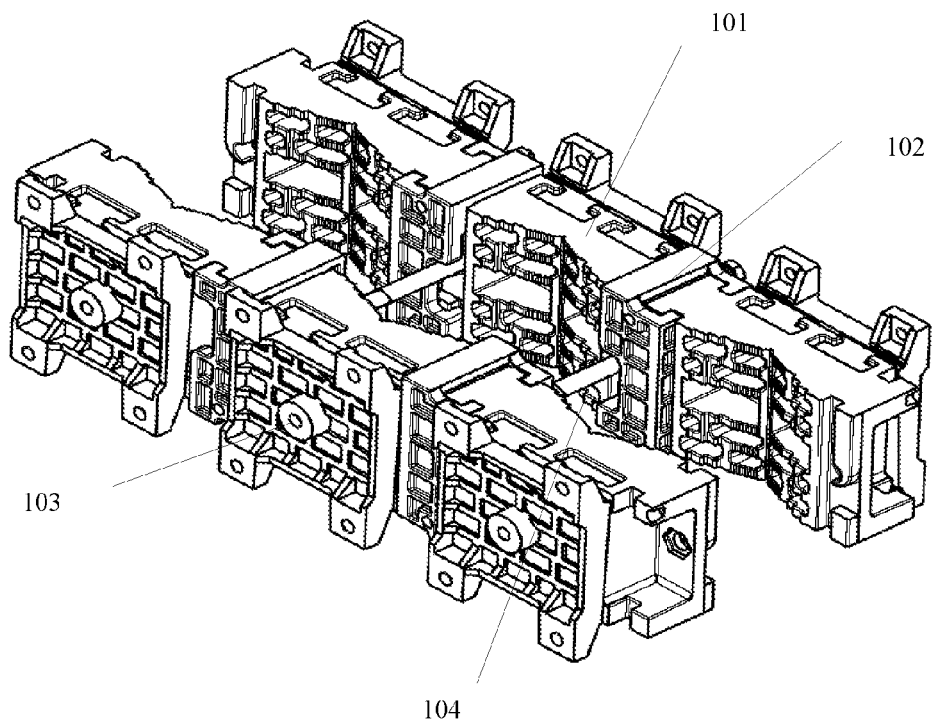
FIG. 1 is a structure diagram of a mounting device according to an embodiment of the present disclosure.

According to the embodiment of the present disclosure, a mounting device is provided. FIG. 1 is a structure diagram of a mounting device according to an embodiment of the present disclosure; as shown in FIG. 1, the mounting device according to the embodiment of the present disclosure includes: a securing clamp 101, a mounting plate 102 and connectors 104, wherein the securing clamp 101 is provided with a mounting hole at each of two ends of the securing clamp 101 respectively, the connectors 104 mount the securing clamp 101 to a fixed surface through the mounting holes, an equipment mounting surface of the securing clamp 101 is provided with a mounting plate 102 connection device, the mounting plate 102 is connected to the securing clamp 101 through the mounting plate 102 connection device, an equipment connection device used for securing equipment is provided on the mounting plate 102, and the securing clamp 101 is provided with an adapter plate mounting device, used for securing an adapter plate, at each of two lateral sides of the securing clamp 101. A V-shaped groove matched with an arc of a pole may be provided in a centre of the fixed mounting surface of the securing clamp 101 contacting the fixed surface.

The connectors 104 may include arched connectors matched with the pole.

Further, the connectors 104 may include bolt-nut sets matched with the mounting holes of the securing clamp 101, and the bolt-nut sets may fasten two securing clamps 101 on a pole back to back through the mounting holes of the two securing clamps 101.

In an exemplary embodiment, the mounting plate 102 connection device may be at least one mounting groove matched with at least one lug on the mounting plate 102; the at least one lug on the mounting plate 102 is mounted on the equipment mounting surface of the securing clamp 101 through the at least one mounting groove.

In an example embodiment, the connectors 104 may include: equipment mounting screws; the equipment connection device on the mounting plate 102 is equipment mounting holes;

and the mounting plate 102 is connected with equipment through the equipment mounting holes and the equipment mounting screws.

In an exemplary embodiment, the adapter plate mounting device at each of two laterals of the securing clamp 101 is a mounting structure matched with a mounting groove of the adapter plate.

The mounting device may further include: an adapter plate used for securing two securing clamps 101;

wherein each of two surfaces of the adapter plate is provided with a mounting groove matched with the mounting structure at each of two laterals of the securing clamp 101; two surfaces of the adapter plate are connected with the mounting structures of the two securing clamps through the mounting grooves.

The mounting device may further include: a fastener matched with a fastening interface on the adapter plate.

The mounting structure of the securing clamp 101 is provided with a fastening groove; a fastening interface matched with the fastening groove is provided on the adapter plate; after the adapter plate is mounted on the securing clamp 101, the fastener fastens the adapter plate with the securing clamp 101 through the fastening interface and the fastening groove.

The above technical scheme in the embodiment of the present disclosure is described below in further detail in conjunction with accompanying drawings.

Figure 7:
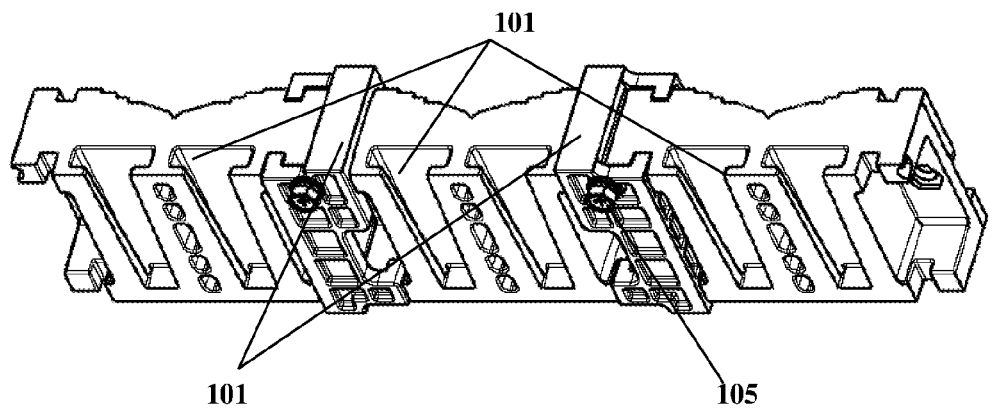
FIG. 7 is a diagram of multiple securing clamps connected through adapter plates according to an embodiment of the present disclosure.

As shown in FIG. 1, the mounting device in the embodiment of the present disclosure includes a securing clamp 101, a mounting plate 102, an adapter plate 103, corresponding connectors 104 and fasteners 105 (not shown in FIG. 1 but shown in FIG. 7).

Figure 2:
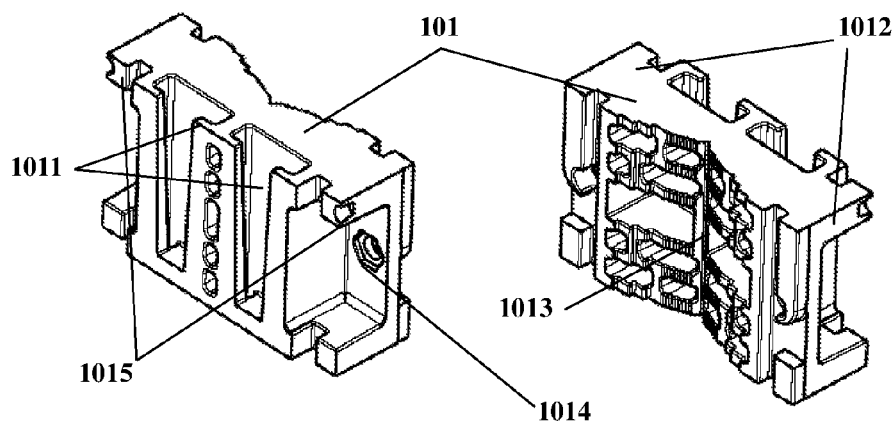
FIG. 2 is a structure diagram of a securing clamp according to an embodiment of the present disclosure.
Figure 6:
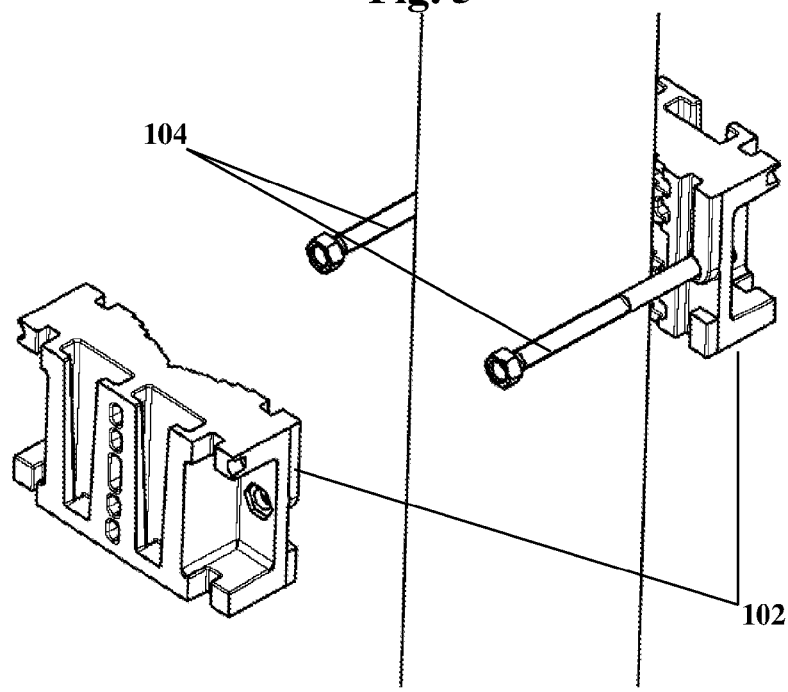
FIG. 6 is a diagram of the installation of a securing clamp pole according to an embodiment of the present disclosure.

As shown in FIG. 2, there is a mounting hole 1014 on each of two ends of the securing clamp 101, which can be connected and mounted on a pole together with the connector 104. There is a V-shaped groove 1013 on the securing clamp 101 being used for pole mounting. After mounted on a pole, as shown in FIG. 6, two securing clamps are opposite and connected through connectors 104, with a high securing reliability.

Figure 3:
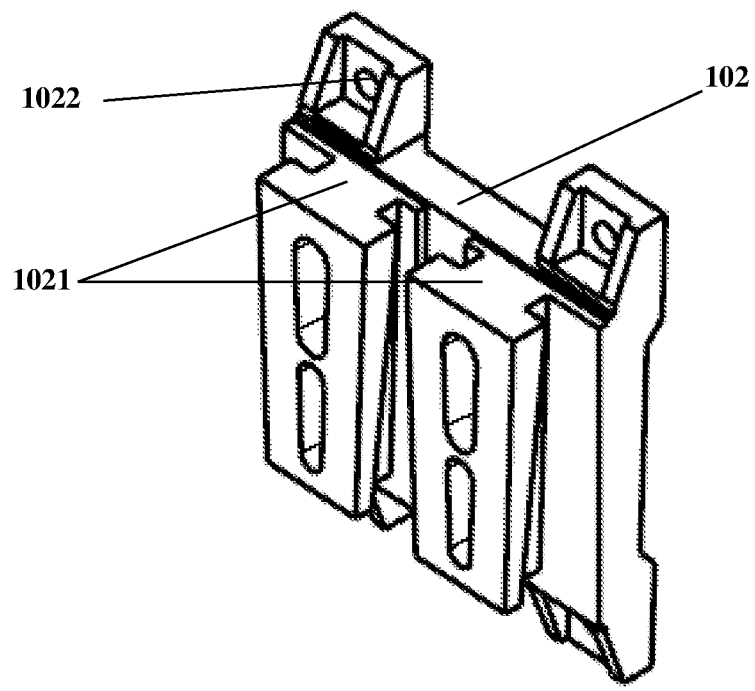
FIG. 3 is a structure diagram of a mounting plate according to an embodiment of the present disclosure.
Figure 5:
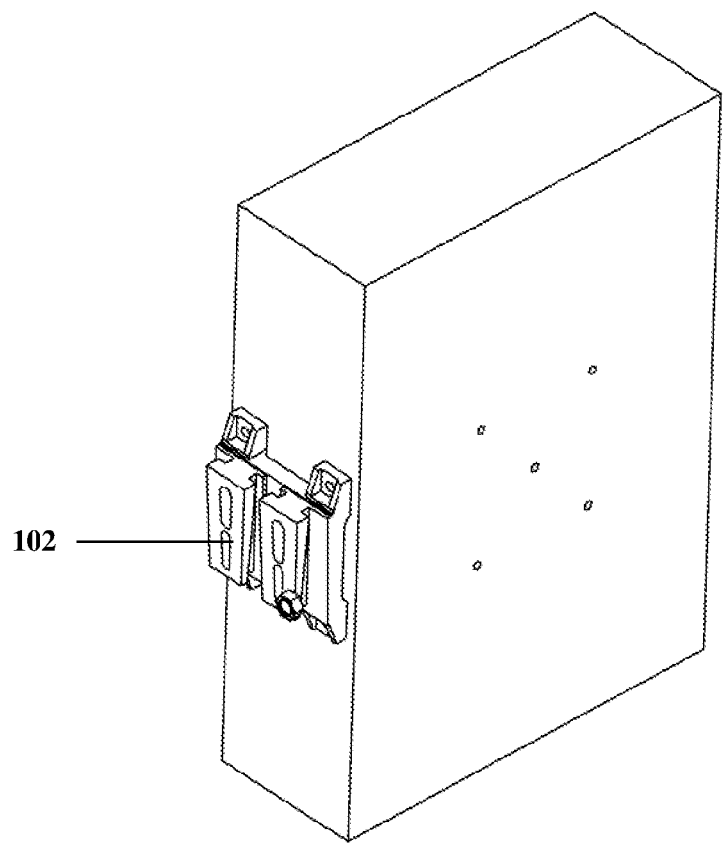
FIG. 5 is a structure diagram of a mounting plate securing a piece of equipment according to an embodiment of the present disclosure.

One surface of the securing clamp 101 is provided with at least one mounting groove 1011, which as shown in FIG. 3 is matched with at least one lug 1021 on the mounting plate 102 and can be used for mounting. The equipment mounting holes 1022 shown in FIG. 3 are mounting holes for connection with a piece of equipment. As shown in FIG. 5, the equipment can be secured on the mounting plate by means of screws passing through the equipment mounting holes 1022.

Figure 4:
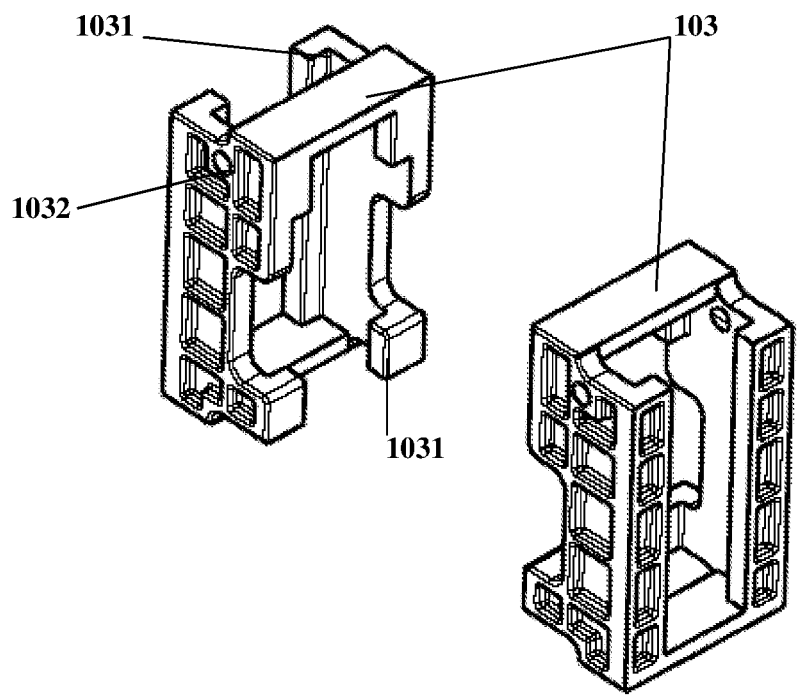
FIG. 4 is a structure diagram of an adapter plate according to an embodiment of the present disclosure.

As shown in FIG. 2, a mounting structure 1012 is provided at each of two laterals of the securing clamp, which as shown in FIG. 4 corresponds to the mounting groove 1031 on the adapter plate 103. Specifically, an adapter plate 103 can be mounted on the mounting structures 1012 of the securing clamp 101 through the mounting groove 1031.

As shown in FIG. 2, on the securing clamp 101, there is a fastening groove 1015 on each mounting structure 1012.

As shown in FIG. 4, there is a fastening interface 1032 on the adapter plate 103, after the adapter plate 103 is mounted on the securing clamp 101, as shown in FIG. 7 the adapter plate 103 and the securing clamp 101 can be fastened together through a fastener 105. Moreover, two sides of the adapter plate 103 can be mounted with a securing clamp 101, so as to connect and fasten two securing clamps 101. With the above operation method, at least two securing clamps 101 can be connected and fastened together.

Figure 8:
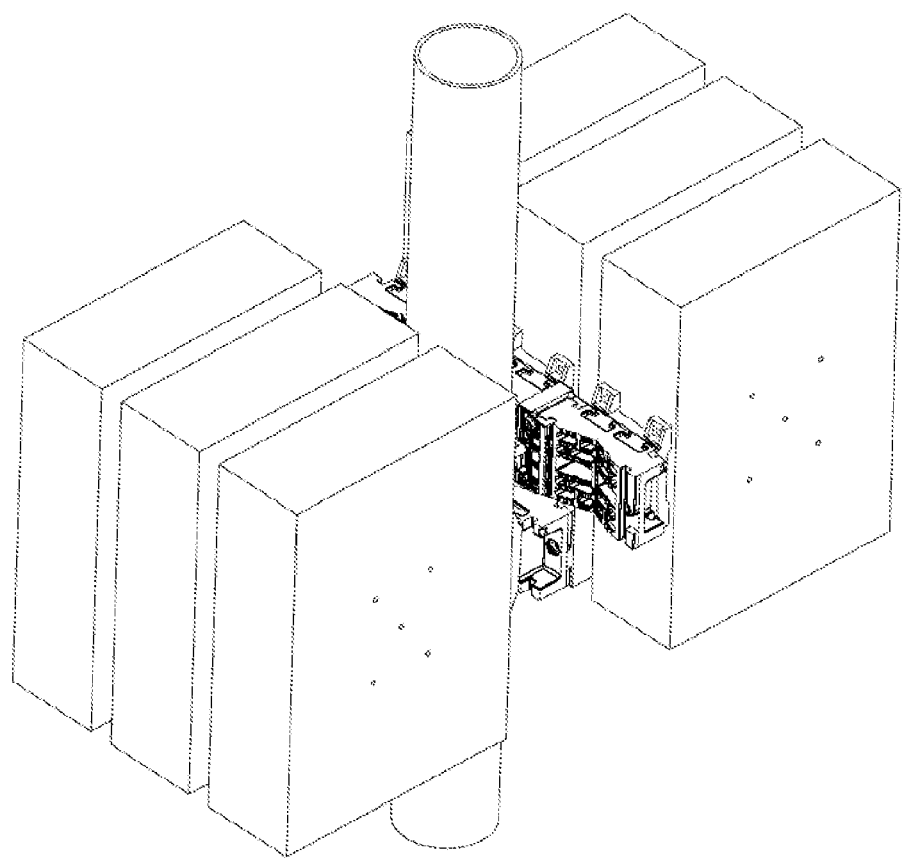
FIG. 8 is a diagram of pole mounting through a mounting device according to an embodiment of the present disclosure.

That is to say, as shown in FIG. 8, at least two pieces of equipment are mounted on a pole, an adapter plate 103 and another securing clamp 101 can be mounted on the lateral of the securing clamp 101, the number of adapter plates 103 and the number of securing clamps 101 can be added as needed; each added securing clamp 101 can be mounted with a piece of equipment.

In an exemplary embodiment, the securing clamp 101, each one of the mounting plate 102 and the adapter plate 103 may be in a shape symmetrical to the middle surface.

In an exemplary embodiment, the fastener 105 may be a bolt, the fastening interface 1032 may be a thread hole, and the fastening groove 1015 may be a tapered groove.

In an exemplary embodiment, the connectors 104 may be bolt-nut sets.

To sum up, with the mounting device provided by the embodiments of the present disclosure, a securing clamp can be connected with another securing clamp through an adapter plate connected on the lateral of the securing clamp, thus the problem in the related art that the mounting device cannot be expanded is solved; the present disclosure can reduce the number of steps and difficulty of high-altitude operations to the greatest extent, shorten the working time of high-altitude operations, reduce the space occupied by engineering installation, thereby reducing the cost of engineering construction and enhancing security.

Obviously, those skilled in the art can make various modifications and variations to the present disclosure without departing from the spirit and scope of the present disclosure. Thus, if these modifications and variations of the present disclosure fall within the scope of the claims of the present disclosure and equivalent technologies thereof, the present disclosure is also intended to include these modifications and variations.

What is claimed is:

1. A mounting device, comprising: a securing clamp, a mounting plate and connectors, wherein
the securing clamp is provided with at least one mounting hole at each of two ends of the securing clamp respectively, the connectors mount the securing clamp to a fixed surface through the mounting holes, an equipment mounting surface of the securing clamp is provided with a mounting plate connection device, the mounting plate is connected to the securing clamp through the mounting plate connection device, an equipment connection device used for securing equipment is provided on the mounting plate, and the securing clamp is provided with an adapter plate mounting device, used for securing an adapter plate, at each of two lateral sides of the securing clamp respectively.

2. The mounting device as claimed in claim 1, wherein a V-shaped groove matched with an arc of a pole is provided in a center of the fixed mounting surface of the securing clamp contacting the fixed surface.

3. The mounting device as claimed in claim 2, wherein the connectors comprise arched connectors matched with the pole.

4. The mounting device as claimed in claim 2, wherein the connectors comprise bolt-nut sets matched with the mounting holes of the securing clamp;
the bolt-nut sets fasten two securing clamps on a pole back to back through the mounting holes of the two securing clamps.

5. The mounting device as claimed in claim 1, wherein the mounting plate connection device is at least one mounting groove matched with at least one lug on the mounting plate; the at least one lug on the mounting plate is mounted on the equipment mounting surface of the securing clamp through the at least one mounting groove.

6. The mounting device as claimed in claim 1, wherein the connectors comprise: equipment mounting screws;
the equipment connection device on the mounting plate is equipment mounting holes; and the mounting plate is connected with equipment through the equipment mounting holes and the equipment mounting screws.

7. The mounting device as claimed in claim 1, wherein the adapter plate mounting device at each of two laterals of the securing clamp is a mounting structure matched with a mounting groove of the adapter plate.

8. The mounting device as claimed in claim 7, further comprising: an adapter plate used for securing two securing clamps;
wherein each of two surfaces of the adapter plate is provided with a mounting groove matched with the mounting structure at each of two laterals of the securing clamp; two surfaces of the adapter plate are connected with the mounting structures of the two securing clamps through the mounting grooves.

9. The mounting device as claimed in claim 8, further comprising: a fastener matched with a fastening interface on the adapter plate.

10. The mounting device as claimed in claim 9, wherein each mounting structure of the securing clamp is provided with a fastening groove; a fastening interface matched with the fastening groove is provided on the adapter plate; after the adapter plate is mounted on the securing clamp, the fastener fastens the adapter plate with the securing clamp through the fastening interface and the fastening groove.

* * * * *